United States Patent
Lei et al.

(10) Patent No.: US 11,030,368 B2
(45) Date of Patent: Jun. 8, 2021

(54) METAL CUT OPTIMIZATION FOR STANDARD CELLS

(71) Applicant: Taiwan Semiconductor Manufacturing Co., Ltd., Hsinchu (TW)

(72) Inventors: Cheok-Kei Lei, Macau (MO); Chi-Lin Liu, New Taipei (TW); Hui-Zhong Zhuang, Kaohsiung (TW); Zhe-Wei Jiang, Hsinchu (TW); Chi-Yu Lu, New Taipei (TW); Yi-Hsin Ko, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/881,706

(22) Filed: May 22, 2020

(65) Prior Publication Data
US 2020/0285792 A1    Sep. 10, 2020

Related U.S. Application Data

(63) Continuation of application No. 15/907,689, filed on Feb. 28, 2018, now Pat. No. 10,691,849.

(60) Provisional application No. 62/564,794, filed on Sep. 28, 2017.

(51) Int. Cl.
| | |
|---|---|
| *G06F 30/327* | (2020.01) |
| *G06F 30/392* | (2020.01) |
| *G06F 30/398* | (2020.01) |
| *H01L 23/52* | (2006.01) |
| *H01L 23/522* | (2006.01) |

(52) U.S. Cl.
CPC .......... *G06F 30/327* (2020.01); *G06F 30/392* (2020.01); *G06F 30/398* (2020.01); *H01L 23/52* (2013.01); *H01L 23/5222* (2013.01)

(58) Field of Classification Search
CPC .............................. G06F 30/327; G06F 30/392
USPC ........................................................ 716/133
See application file for complete search history.

(56) References Cited

U.S. PATENT DOCUMENTS

| | | | |
|---|---|---|---|
| 9,978,682 B1 | 5/2018 | Correale, Jr. | |
| 2004/0251501 A1 | 12/2004 | Catalasan | |
| 2012/0233575 A1* | 9/2012 | Kashyap | ................ G06F 30/39 716/55 |
| 2015/0017572 A1 | 1/2015 | Ishii | |
| 2015/0278428 A1* | 10/2015 | Wang | .................... G06F 30/392 716/112 |
| 2017/0301618 A1* | 10/2017 | Chen | .................. H01L 23/5226 |
| 2018/0018419 A1* | 1/2018 | Rowhani | ............... G06F 30/392 |
| 2018/0151567 A1 | 5/2018 | Lin | |
| 2019/0103372 A1 | 4/2019 | Chen | |
| 2019/0206787 A1 | 7/2019 | Bouche | |

* cited by examiner

*Primary Examiner* — Suchin Parihar
(74) *Attorney, Agent, or Firm* — Sterne, Kessler, Goldstein & Fox P.L.L.C.

(57) ABSTRACT

The present disclosure describes a method for optimizing metal cuts in standard cells. The method includes placing a standard cell in an layout area and inserting a metal cut along a metal interconnect of the standard cell at a location away from a boundary of the standard cell. The method further includes disconnecting, at the location, a metal portion of the metal interconnect from a remaining portion of the metal interconnect based on the metal cut.

20 Claims, 9 Drawing Sheets

600

Scanning APR database to determine standard cells that need to be optimized — 610

Placing metal cuts the boundaries of the selected standard cells and inside of the selected standard cells to remove or disconnect metal portions to optimize the lengths of the metal interconnects — 620

Generating child cells from the optimized standard cells and forming a new library to include the child cells — 630

METAL CUT OPTIMIZATION FOR STANDARD CELLS

CROSS-REFERENCE TO RELATED APPLICATION

This application is a continuation of U.S. Non-provisional application Ser. No. 15/907,689, titled "Metal Cut Optimization for Standard Cells," which was filed on Feb. 28, 2018, which claims the benefit of U.S. Provisional Patent Application No. 62/564,794, titled "Metal Cut Optimization for Standard Cells," which was filed on Sep. 28, 2017, all of which are incorporated herein by reference in their entireties.

BACKGROUND

The semiconductor integrated circuit (IC) industry has experienced exponential growth. In semiconductor IC design, standard cell methodologies are commonly used for the design of semiconductor devices on a chip. Standard cell methodologies use standard cells as abstract representations of certain functions to integrate millions devices on a single chip. As ICs continue to scale down, more and more devices are integrated into the single chip. Consequently, due to scaling down, parasitic capacitances in standard cells can increase, thus impacting standard cell performance.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

In semiconductor IC design, to simplify chip-level routing in an electronic design automation (EDA) tool, pin access points of standard cells are sometimes reserved for connection with an upper-layer metal interconnect. When pin access points are reserved, the lengths of the metal interconnects can be made longer. As a result, parasitic capacitances formed in the metal interconnects are increased. To be consistent with design rules, metal cuts can be placed on cell boundaries of a standard cell layout. Accordingly, metal interconnects (e.g., M0 interconnects) across the cell boundaries are disconnected, and adjacent standard cells are separated/disconnected. A purpose of metal cuts is to separate adjacent standard cells such that these cells can perform specified functions. For example, two standard cells can be connected by a metal interconnect across cell-to-cell boundaries of the two standard cells. A metal cut can be placed on the metal interconnect to disconnect or separate the two standard cells.

Redundant or unused metal interconnect portions can remain in the standard cells after separation, causing parasitic capacitances in the standard cells. Because setup time is a minimum amount of time a data signal should be held ready before a clock event samples the data and is affected by a time delay (a product of circuit resistance and circuit capacitance), greater parasitic capacitances can cause longer time delay and thus longer setup time. A greater parasitic capacitance also results in higher power consumption due to energy loss in the charging-discharging process. Especially, the setup time of a critical path (the path between an input and an output value that has the longest delay) of a standard cell is significantly affected by the parasitic capacitances in the standard cell. Thus, the parasitic capacitances in the redundant or unused metal interconnect portions of critical paths can of a standard cells result in longer setup times and higher power consumption in the standard cells.

Embodiments of the present disclosure describe a metal cut process to optimize the removal or disconnection of metal interconnect portions in standard cells to reduce parasitic capacitance. Benefits of reducing parasitic capacitance in the standard cell include improving setup time of critical paths and reducing power consumption caused by critical paths, thus improving standard cell performance. In reducing parasitic capacitance, embodiments of the present disclosure do not require additional mask layers and have little or no impact on the layout area of the standard cells.

Further, embodiments of the disclosed metal cut process can be used in the fabrication of devices at various process technology nodes, such as 5-nm and 7-nm fabrication processes. To implement the metal cut process, a metal-cut mask layer (e.g., a mask layer to expose metal cuts and to cover portions of layout that do not need metal cuts) can be modified. No additional metal-cut mask layers are needed, according to some embodiments. Further, the metal cut process has minimal or no impact to the layout of the standard cell.

A standard cell structure can include one or more standard cells from a standard cell library, according to some embodiments. The standard cell can be any or all an AND, OR, XOR, XNOR, NAND, inverter, or other suitable logic device. In some embodiments, metal cuts (e.g., boundary metal cuts and internal metal cuts) are placed by a modified metal-cut mask layer, exposing boundary metal cuts and internal metal cuts, on the standard cells being optimized. As referred to herein, term "boundary metal cuts" refer to metal cuts placed along cell boundaries of standard cells; and term "internal metal cuts" refer to as metal cuts placed according to the disclosed metal cut structure (e.g., metal cuts in addition to the boundary metal cuts such as non-boundary metal cuts). Terms "boundary metal cuts" and "internal metal cuts" do not indicate any differences of metal cuts in structures, usage, locations, etc.

Figure 1A:
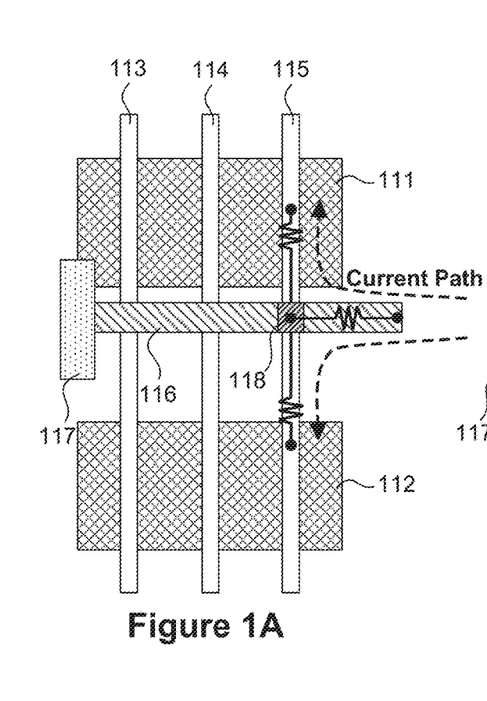
FIG. 1A-1C are illustrations of example standard cell layout views that reduce coupling capacitance based on an optimized metal cut structure, according to some embodiments.
Figure 1B:
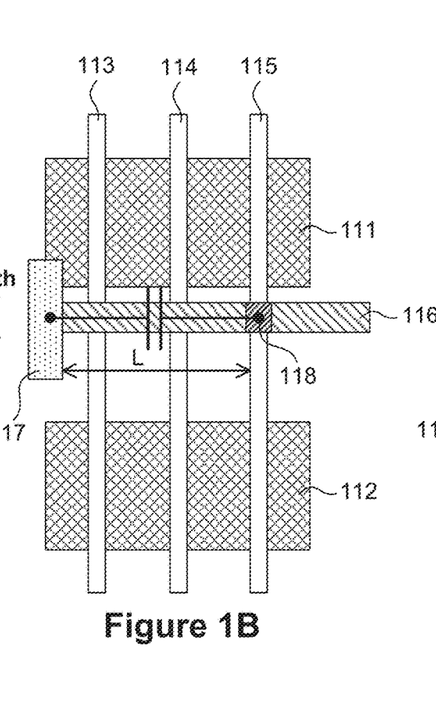
Figure 1C:
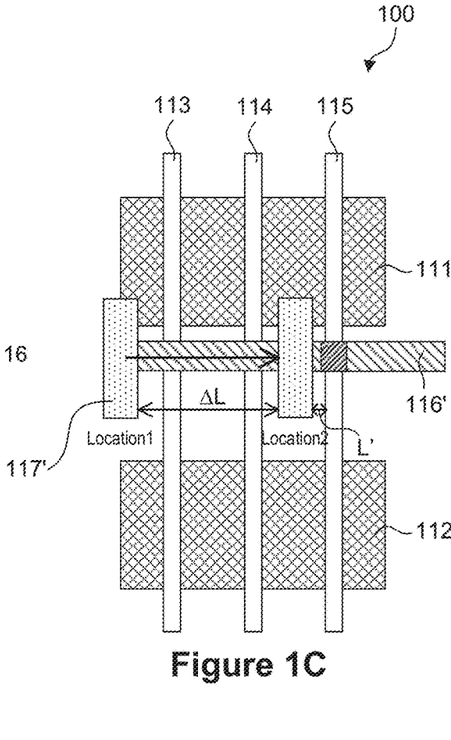

FIGS. 1A-C are illustrations of example standard cell layout views that reduce a parasitic capacitance based on an optimized metal cut structure, according to some embodiments. For ease of explanation, certain portions of a standard cell structure is shown. As shown in FIGS. 1A-C, standard cell structure 100 includes source and drain regions 111 and 112 (represented as "diffusion OD"), gate structures 113, 114, and 115 (represented as "poly"), a metal interconnect 116 (represented as "metal"), a boundary metal cut 117 (represented as "metal cut"), and a via 118 (represented as "VG"). Gate structures 113-115 are placed over source and drain regions 111 and 112. Metal interconnect 116 is placed over gate structures 113-115 and is electrically connected with gate structure 115 through via 118. A boundary metal cut 117 is placed on an end of metal interconnect 116 and disconnects the portion of metal interconnect 116 in standard cell structure 100 from a metal interconnect in an adjacent standard cell.

In referring to FIG. 1A, during operation, electric current (e.g., gate control current flowing through the metal interconnects for turning on and off devices) flows from a second end of metal interconnect 116 to gate structure 115 along metal interconnect 116. Because no vias are formed between metal interconnect 116 and gate structures 113 and 114, little or no DC current flows between via 118 and boundary metal cut 117. However, parasitic capacitance can be formed in the metal interconnect portion between via 118 and boundary metal cut 117 due to coupling between this metal interconnect portion and other metal interconnects (not shown). A parasitic capacitance value depends on a length L of a metal interconnect portion between via 118 and boundary metal cut 117, as shown in FIG. 1B. In FIG. 1C, in some embodiments, an internal metal cut 117' can be placed at location 2 to decrease the length L, thus reducing the parasitic capacitance. That is, the parasitic capacitance formed in the remaining metal interconnect 116' depends on a shorter length L'. In some embodiments, location 2 and the shortened length $\Delta L$ ($\Delta L = L - L'$) can be optimized such that the remaining parasitic capacitance caused by the remaining metal interconnect portion between via 118 and internal metal cut 117' is small or negligible. Further, location 2 can be optimized such that the placement of internal metal cut 117' has little or no impact on adjacent standard cell structures, according to some embodiments.

FIGS. 2A-E are illustrations of example spacing rules associated with an optimized metal cut structure, according to some embodiments. The metal cuts shown in FIGS. 2A-E represent suitable metal cuts (e.g., boundary metal cuts and internal metal cuts) in metal interconnects of various metal interconnect levels (e.g., metal interconnect levels M0-M5). The term "CPP" is a cell poly pitch, which is a pitch between adjacent active gate structures. In some embodiments, the length or spacing of CPP is equal to a total spacing between centers of adjacent metal cuts, which includes the spacing between the boundaries of adjacent metal cuts and the width of one metal cut. The width of a metal cut is represented as "W." A horizontal direction (or x-direction) represents a direction that a metal interconnect extends. A vertical direction (or y-direction) represents a direction that parts under and connected by the metal interconnect extend. For example, the horizontal direction represents the direction M0 interconnect extends, and the vertical direction represents the direction the gate structures formed under M0 interconnects extend (e.g., the gate structures extend in a perpendicular orientation relative to the direction M0 interconnect extends).

Figure 2A:
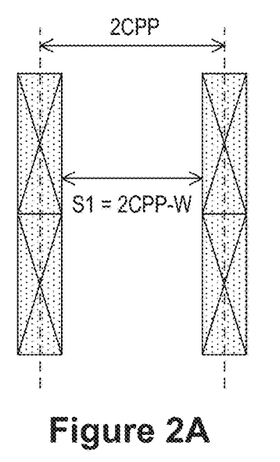
FIGS. 2A-2E, 3, and 4 are illustrations of example spacing rules associated with an optimized metal cut structure, according to some embodiments.

In some embodiments, the spacing rules can depend on a location of the optimized metal cut structure. For example, for metal cuts placed the same metal interconnect (e.g., aligned along the horizontal direction), the minimum metal cut spacing or separation between centers of adjacent metal cuts is approximately 2·CPP and the minimum metal cut spacing between boundaries of adjacent metal cuts is approximately twice the spacing of CPP minus the width of a metal cut (e.g., (2·CPP–W)). FIGS. 2A and 2D illustrate examples of the minimum metal cut spacing between adjacent metal cuts.

For metal cuts placed on different metal interconnects, two scenarios can occur. First, if two metal cuts are misaligned along the vertical direction, the minimum metal cut spacing between two metal cuts along the horizontal direction is approximately the spacing of CPP (as illustrated in FIG. 2D) minus the width of a metal cut or (CPP–W). Second, if two metal cuts are aligned along the vertical direction, the minimum metal cut spacing between the two metal cuts along the horizontal direction is zero. In both scenarios, the two metal cuts can be placed in two metal interconnects, where the two metal interconnects can be placed as close as being adjacent to each other. That is, if the two metal cuts are aligned along the vertical direction, the two metal cuts can be placed as close as being adjacent to each other along the vertical direction; if the two metal cuts are misaligned along the vertical direction, the two metal cuts can be placed in adjacent metal interconnects and have a minimum metal cut spacing of about (CPP–W) along the horizontal direction. For illustrative purposes, in some embodiments, the horizontal direction and the vertical direction are merely used to illustrate two different directions and do not reflect the actual directions structures extend or are aligned. In some embodiments, a minimum horizontal metal cut spacing represents a minimum metal cut spacing along the horizontal direction between two metal cuts, and a minimum vertical metal cut spacing represents a minimum metal cut spacing along the vertical direction between two metal cuts.

Figure 2B:
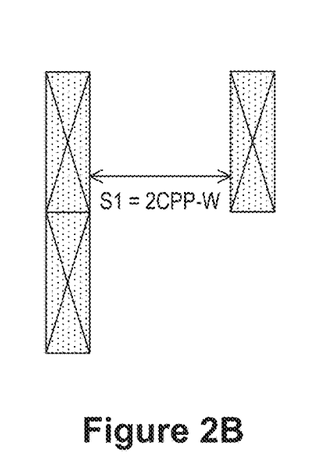
Figure 2C:
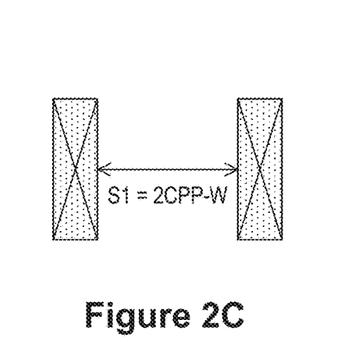
Figure 2D:
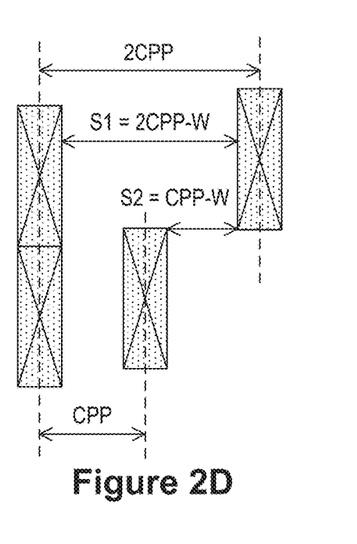
Figure 2E:
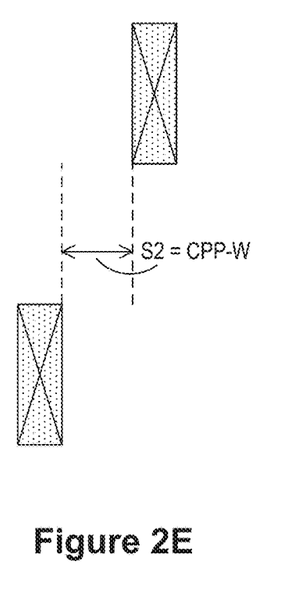

For example, FIGS. 2A-2E are illustrations of example spacing rules associated with an optimized metal cut structure, according to some embodiments. Metal cuts aligned along the horizontal direction are metal cuts placed on the same metal interconnect, and metal cuts aligned along the vertical direction are placed on different metal interconnects. The minimum horizontal metal cut spacing between adjacent metal cuts placed on the same metal interconnect can be about S1, where S1 equals (2·CPP–W.) As an example, in FIGS. 2A-2D, the minimum horizontal metal cut spacing between two adjacent metal cuts, on same metal interconnects, can be about S1. As shown in FIGS. 2A, 2B, and 2D, two metal cuts aligned along the vertical direction can be placed to be adjacent to one another. Further, FIG. 2D also illustrates a comparison between the minimum horizontal cut spacing between adjacent metal cuts on the same metal interconnect and between neighboring metal cuts on an adjacent metal interconnect. As shown in FIG. 2D, the minimum horizontal metal cut spacing between metal cuts on the same metal interconnect can be about S1, and the minimum horizontal metal cut spacing for a misaligned neighboring metal cuts on adjacent metal interconnects can be approximately S2, where S2 equals to (CPP−W.) In FIG. 2E, two metal cuts are placed on metal interconnects separated by at least one metal interconnect, and the minimum horizontal cut spacing between the two metal cuts can be approximately S2. The number of metal interconnects between the metal cuts can be any suitable positive integer. FIGS. 2A-E illustrate that for metal cuts placed on different metal interconnects and aligned along the vertical direction, no minimum vertical metal cut spacing is required, according to some embodiments. That is, along vertical direction, metal cuts can be placed adjacent to one another.

Figure 3:
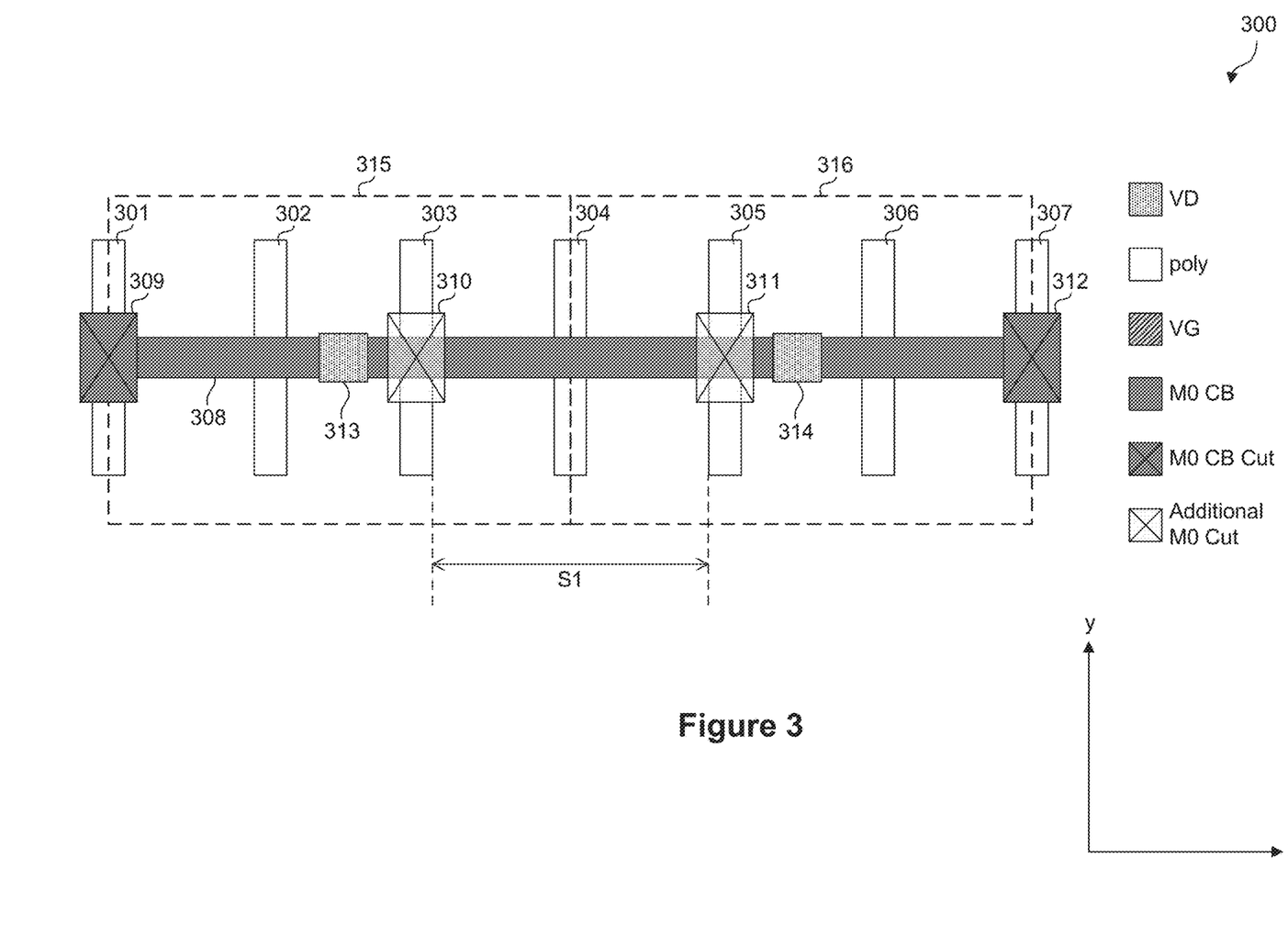

FIG. 3 illustrates additional example spacing rules for an optimized metal cut structure, according to some embodiments. In FIG. 3, structure 300 can include standard cell structures 315 and 316, outlined in dashed lines. For illustrative purposes, only certain parts of the standard cell structures 315 and 316 are shown to describe the spacing rules. Standard cell 315 can include gate structures 301, 302, 303, and 304 (represented as "poly"), and standard cell 316 can include gate structures 304, 305, 306, and 307 (represented as "poly"). Cell boundaries of standard cells 315 and 316 can abut on gate structure 304. M0 interconnect 308 (represented as "M0 CB") can be formed over the gate structures 301-307. Standard cell 315 can include via 313 (represented as "VD") for electrically connecting M0 interconnect 308 with source and drain region (not shown) in standard cell 315. Standard cell 316 can include via 314 (represented as "VD") for electrically connecting M0 interconnect with source and drain region (not shown) in standard cell 316. Metal cuts 309 and 312 (represented as "M0 CB cut") can be boundary metal cuts placed at the cell boundaries of standard cells 315 and 316, respectively. In operation, electric current flows to gate structures in standard cells 315 and 306 through vias 313 and 314, the M0 interconnect portion between gate structures 303 and 305 can be redundant or unused.

Based on the disclosed metal cut optimization structure, internal metal cuts can be placed closer to vias 313 and 314 to reduce parasitic capacitances in the disconnected M0 interconnect portions. In some embodiments, internal metal cuts 310 and 311 (represented as "additional M0 cut") are placed respectively along gate structures 303 and 305. Consistent with the spacing rules of the metal cut optimization structure, the metal cut spacing between metal cuts 310 and 311 can be equal to about S1. Based on the disclosed metal cut optimization structure, redundant M0 interconnect portion between gate structures 304 and 305 can be removed from M0 interconnect 308 in standard cell 316, and redundant M0 interconnect portion between gate structures 303 and 304 can be removed from M0 interconnect 308 in standard cell 315. In some embodiments, no boundary metal cut needs to be placed on the cell-to-cell boundaries of standard cells 315 and 316. Thus, parasitic capacitances can be reduced in standard cells 315 and 316.

Further, in referring to FIG. 3, the spacing rules of the metal cut optimization structure apply to metal cuts in the same standard cell and different standard cells. That is, the two metal cuts, restricted by the spacing rules, can be placed in the same standard cell or different standard cells. The two metal cuts can be two internal metal cuts, two boundary metal cuts, or one internal metal cut and one boundary metal cut. For example, metal cuts along a same M0 interconnect 308 can be separated by at least the minimum horizontal metal cut spacing defined by the spacing rules, where the two metal cuts can be inserted into the same standard cell or different standard cells. For example, internal metal cuts 310 and 311, arranged in two standard cells 315 and 316, are separated by about S1. That is, the spacing rules can ensure the insertion of metal cuts into one standard cell does not affect the proper metal interconnect lengths of adjacent standard cells. Thus, the insertion of metal cuts in a standard cell can have little impact on the proper metal interconnect lengths of adjacent/neighboring standard cells.

Figure 4:
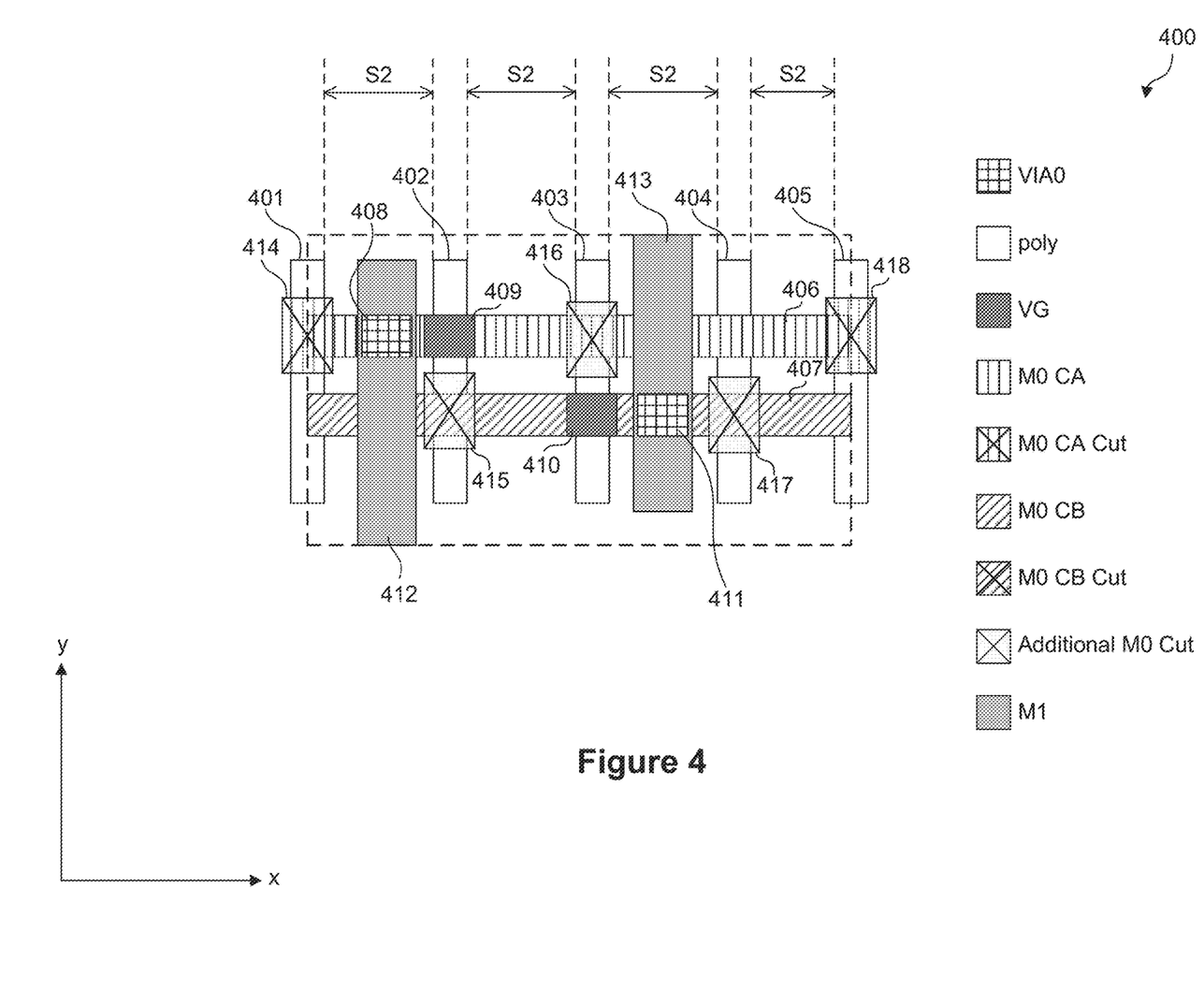

FIG. 4 illustrates additional example spacing rules for an optimized metal cut structure, according to some embodiments. For illustrative purposes, only certain parts of the standard cell structure 400 are shown to describe the spacing rules. In FIG. 4, standard cell structure 400 can include gate structures 401, 402, 403, 404, and 405 (represented as "poly"), first M0 interconnect 406 (represented as "M0 CA"), second M0 interconnect 407 (represented as "M0 CB"), first vias 408 and 411 (represented as "VIA 0"), second vias 409 and 410 (represented as "VG"), M1 interconnects 412 and 413 (represented as "M1"), and boundary metal cut 414 (represented as "M0 CA cut"). M0 interconnects 406 and 407 can be local interconnects M0 CA and M0 CB, respectively. M0 interconnects 406 and 407 can be formed over gate structures 401-405. First vias 408 and 411 can provide electrical connection between M0 interconnects (i.e., 406 and 407) and M1 interconnects (i.e., 412 and 413). Second vias 409 and 410 can form electrical connection between M0 interconnects 406 and 407 and corresponding gate structures 402 and 403. A cell boundary of standard cell 400 can align along gate structures 401 and 405, respectively. Boundary metal cuts 414 and 418 can be placed on the cell boundary of standard cell 400, at the intersection between gate structure 401 and M0 interconnect 406 and at the intersection between gate structure 405 and M0 interconnect 406. First M0 interconnect 406 and second M0 interconnect 407 can extend at least substantially along a same direction (e.g., horizontal direction or x-direction), and gate structures 401-405 can extend at least substantially along a same direction (e.g., vertical direction or y-direction).

Based on the disclosed metal cut optimization structure, internal metal cuts can replace some of the boundary metal cuts to reduce redundant metal interconnect portions. For example, internal metal cuts 415, 416, and 417 are placed on M0 interconnects 406 and 407. The arrangement of these internal metal cuts can reduce the number of boundary metal cuts placed on the cell boundary of standard cell structure 400. Meanwhile, the arrangement of metal cuts 414-417 are consistent with the spacing rules of the metal cut optimization structure.

As referring to FIG. 4, internal metal cut 416 can be placed on the same first M0 interconnect as boundary metal cut 414. To be consistent with the spacing rules, in some embodiments, the spacing between boundary metal cut 414 and internal metal cut 416 needs to be at least about the minimum horizontal metal cut spacing S1. Accordingly, internal metal cut 416 can be placed at the intersection of first M0 interconnect 406 and gate structure 403 to ensure the spacing between metal cut 414 and internal metal cut 416 is at least about S1. Also, redundant metal interconnect portion of first M0 interconnect between gate structures 403 and 405 can be removed/disconnected to reduce parasitic capacitance formed in this portion.

Further, as shown in FIG. 4, internal metal cut 415 can be placed at the intersection between second M0 interconnect 407 and gate structure 402, and internal metal cut 417 can be placed at the intersection between second M0 interconnect 407 and gate structure 404. To be consistent with the spacing rules, the spacing between internal metal cuts 415 and 417 can be at least about S1. Also, the horizontal spacing between metal cut 414 (in first M0 interconnect 406) and internal metal cut 415 (in second M0 interconnect 407) can be at least about S2. Similarly, the horizontal spacing between internal metal cut 416 (in first M0 interconnect 406) and internal metal cut 417 (in second M0 interconnect 407) can be at least about S2. Thus, internal metal cuts 415 and 417 can be respectively placed at the intersections of second M0 interconnect and gate structures 402 and 404. Accordingly, redundant metal interconnect portions of second M0 interconnect between gate structures 401 and 402, and between gate structures 404 and 405 can be removed/disconnected to further reduce parasitic capacitances.

Thus, as referring to FIG. 4, using the disclosed metal cut optimization structure, redundant metal interconnect portions between gate structures 403 and 405, 401 and 402, and 404 and 405 can be removed/disconnected. Parasitic capacitances formed in standard cell 400 can be minimized or optimized and operations of standard cell 400 are not affected.

In some embodiments, pins are formed on M0 interconnects or between M0 interconnects and M1 interconnects for transmitting signals through the metal interconnects. In an automatic place and route (APR) process, redundant metal interconnect portions are removed after pins are accessed. In some other embodiments, redundant metal interconnect portions are removed before pins are accessed. The specific timing of removing the metal interconnect portions can be based layout designs and applications and is not be limited by the embodiments of the present disclosure.

Figure 5A:
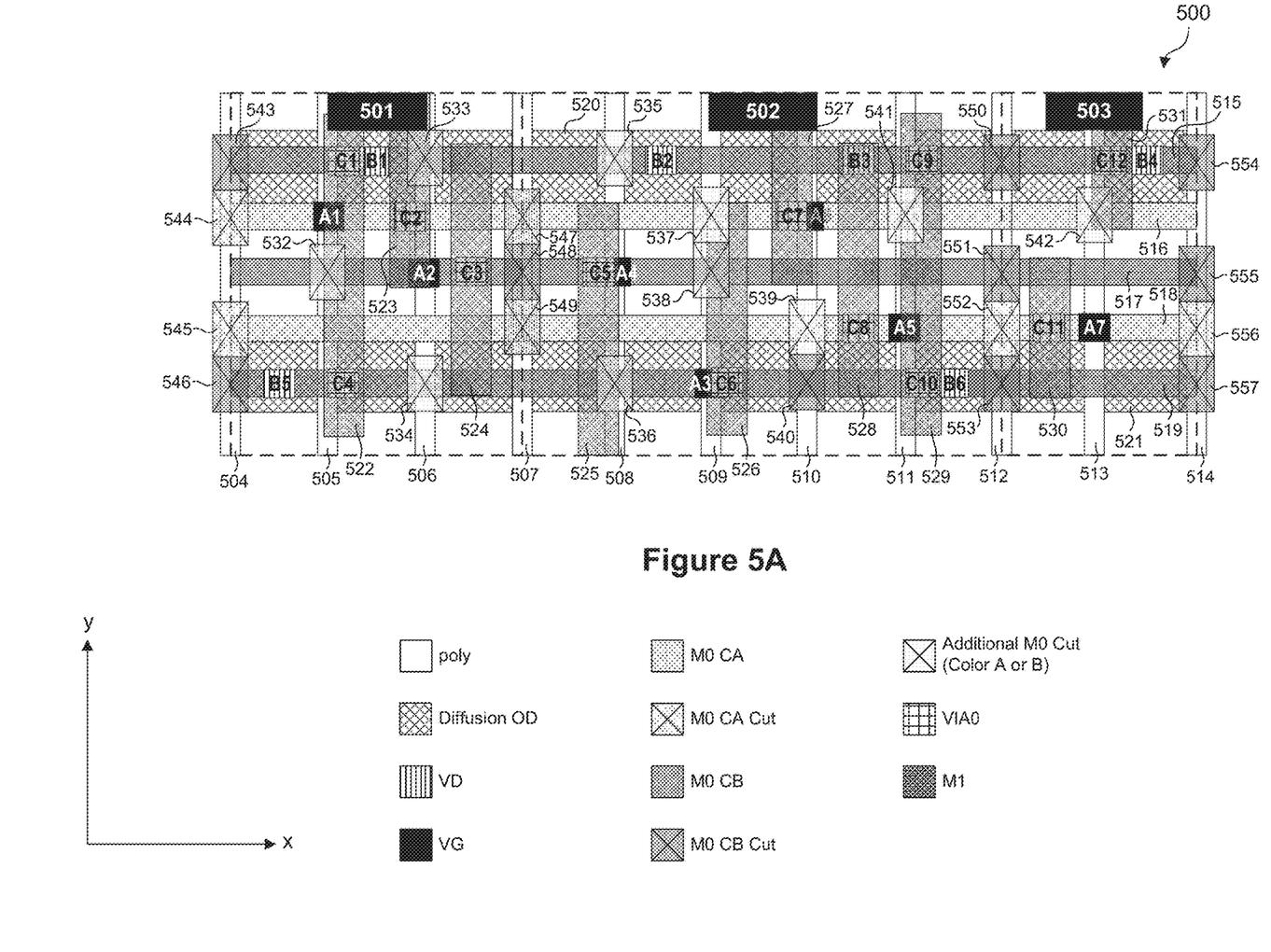
FIGS. 5A and 5B are illustrations of layout views of a standard cell structure optimized based on an optimized metal cut structure, according to some embodiments.
Figure 5B:
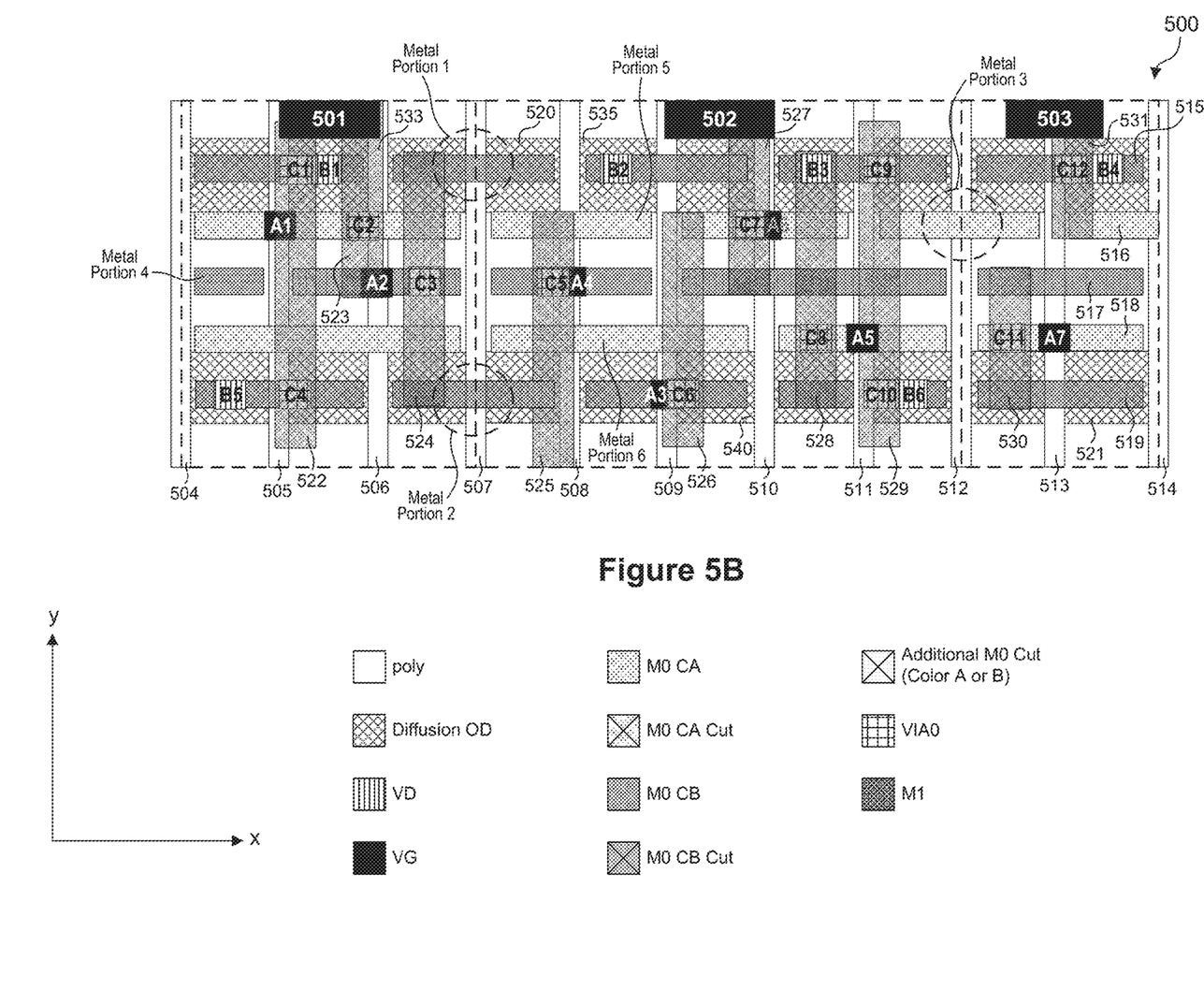

FIGS. 5A and 5B illustrate layout views (or wafer views) of example standard cell structure optimized based on an optimized metal cut structure, according to some embodiments. FIG. 5A is a layout view (or wafer view) of standard cell structure 500 after an APR process, showing the arrangement of metal cuts. The arrangement of metal cuts is consistent with the spacing rules of the metal cut optimization structure. FIG. 5B is a layout view (or a wafer view) of standard cell structure 500 after metal cuts are removed/disconnected in the wafer. For illustrative purposes, only certain parts of the standard cell structure 500 are shown to describe the example.

As shown in FIGS. 5A and 5B, standard cell structure 500 can include standard cells 501, 502, and 503, separated by cell boundaries and represented by the dashed lines. Standard cell 501 can include gate structures 504, 505, 506, and 507. Standard cell 502 can include gate structures 507, 508, 509, 510, 511 and 512. Standard cell 503 can include gate structures 512, 513, and 514. Gate structures 504-514 (represented as "poly") can be aligned along a vertical direction (e.g., y-direction). Cell-to-cell boundaries of standard cells 501 and 502 can abut along gate structure 507, and cell-to-cell boundaries of standard cells 502 and 503 can abut along gate structure 512. First M0 interconnect 515, second M0 interconnect 516, third M0 interconnect 517, fourth M0 interconnect 518, and fifth M0 interconnect 519 can be formed over gate structures 504-514 and can extend through standard cells 501-503 along a horizontal direction (e.g., x-direction). First M0 interconnect 515, third M0 interconnect 517, and fifth M0 interconnect 519 can be local M0 CB interconnects (represented as "M0 CB"). Second M0 interconnect 516 and fourth M0 interconnect 518 can be local M0 CA interconnects (represented as "M0 CA"). First source and drain region 520 and second source and drain region 521 (represented as "diffusion OD") can extend along the horizontal direction. Standard cell 501 can further include first M1 interconnect 522, second M1 interconnect 523, and third M1 interconnect 524. Standard cell 502 further can include third M1 interconnect 525, fourth M1 interconnect 526, fifth M1 interconnect 527, sixth M1 interconnect 528, and seventh M1 interconnect 529. Third standard cell 503 can further include eighth M1 interconnect 530 and ninth M1 interconnect 531. M1 interconnects (represented as "M1") can be formed over M0 interconnects and can extend along the vertical direction. A1-A7 (represented as "VG") can be vias connecting M0 interconnects and corresponding gate structures. B1-B6 (represented as "VD") can be vias connecting M0 interconnects and corresponding source and drain regions. C1-C12 (represented as "VIA0") can be vias connecting M interconnects and corresponding M0 interconnects. Standard cells 501-503 can further include boundary metal cuts (represented as "M0 CA cut" and "M0 CB cut") placed on the cell-to-cell boundaries for separating or disconnecting adjacent standard cells. For example, boundary metal cuts 543-557 are placed on the cell-to-cell boundary of standard cells 501-503. As shown in FIG. 5A, standard cell 501 further can include internal metal cuts 532, 533, and 534, standard cell 502 can further include internal metal cuts 535, 536, 537 538, 539, 540, and 541, and standard cell 503 can further include internal metal cut 542.

In standard cell 501, internal metal cuts 532-534 can each be placed in a different M0 interconnect. In some embodiments, the minimum horizontal metal cut spacing between two metal cuts (e.g., any two of internal metal cuts 532-534 and boundary metal cuts 544-549) can be about S1 if the two metal cuts are placed in the same metal interconnect, about S2 if the two metal cuts are placed in different and non-adjacent metal interconnects, and zero if the two metal cuts are placed in adjacent metal interconnects, satisfying the spacing rules of the metal cut optimization structure. Internal metal cuts 532, 533, and 534 can each be inserted to remove/disconnect an unused metal portion in the corresponding metal interconnect (e.g., between the location of the metal cut and a cell boundary of standard cell 501). Meanwhile, the insertion of these internal metal cuts can be used to replace boundary metal cuts on a cell boundary of standard cell 501 so the number of metal cuts can be minimized or optimized.

In standard cell 502, internal metal cuts 535, 536, 537, 538, and 539 can each be placed in a different M0 interconnect, internal metal cut 540 can be placed in the same M0 interconnect 519 as internal metal cut 536, and internal metal cut 541 can be placed in the same M0 interconnect 516 as internal metal cut 537. Because none of internal metal cuts 535, 536, 537, and 539 are aligned along the vertical direction, the minimum horizontal metal cut spacing between any two of these metal cuts can be about S2. Similarly, because none of internal metal cuts 535, 536, 538, 539 and 541 are aligned along the vertical direction, the minimum horizontal metal cut spacing between any two of these metal cuts can be about S2. Further, because internal metal cuts 537 and 538 can be aligned along the vertical direction, and internal metal cuts 539 and 540 can be aligned along the vertical direction, the minimum horizontal metal cut spacing between internal metal cut 538 and other internal metal cuts and between internal metal cut 540 and other metal cuts each can be same as internal metal cut 537 and internal metal cut 539, respectively, which is about S2. In addition, because internal metal cuts 536 and 540 can be placed in the same M0 interconnect 519, and internal metal cuts 537 and 541 can be placed in the same M0 interconnect 516, the minimum horizontal metal cut spacing between internal metal cuts 536 and 540 can be about S1, and the minimum horizontal metal cut spacing between internal metal cuts 541 and 537 can be about S1. In some embodiments, the minimum horizontal metal cut spacing between two metal cuts (e.g., any two of internal metal cuts 535-539 and boundary metal cuts 547-553) can be about S1 if the two metal cuts are placed in the same metal interconnect, about S2 if the two metal cuts are placed in different and non-adjacent metal interconnects, and zero if the two metal cuts are placed in adjacent metal interconnects, satisfying the spacing rules of the metal cut optimization structure. The insertion of internal metal cuts 535, 536, and 541 can also be used to replace boundary metal cuts (e.g., one or more of boundary metal cuts 547-553) of standard cell 502. To be consistent with the spacing rules, in some embodiments, the minimum horizontal metal cut spacing between internal metal cuts 533 and 535 is about S1, and the minimum horizontal metal cut spacing between internal metal cuts 534 and 536 is about S1.

In standard cell 503, internal metal cut 542 can be placed in M0 interconnect 516, same as internal metal cut 541 in standard cell 502. Accordingly, in some embodiments, the minimum horizontal metal cut spacing between internal metal cuts 541 and 542 is about S1. Because internal metal cut 542 is placed in a different metal interconnect than the boundary metal cuts (e.g., 550-557), in some embodiments, the minimum horizontal metal cut spacing between internal metal 542 and the closest boundary metal cut is about S2, satisfying the spacing rules of the metal cut optimization structure.

As shown in FIG. 5A, based on the disclosed metal cut optimization structure, the locations and number of internal metal cuts can be optimized so that the internal metal cuts can remove a maximum/optimized number of parasitic capacitances without affecting the proper metal interconnect lengths of the standard cells. In some embodiments, the internal metal cuts are inserted in additional to the boundary metal cuts. In some embodiments, the internal metal cuts are inserted to replace at least some boundary metal cuts. In determining the locations/locations of the internal metal cuts, the spacing rules of the metal cut optimization structure can be applied in and between standard cells. Thus, the number of parasitic capacitances removed using the metal cut optimization structure can be optimized or maximized without violating any design rules.

FIG. 5B illustrates a wafer-level view of standard cell structure 500 after metal portions corresponding to the boundary metal cuts and internal metal cuts are removed/disconnected. As shown in FIG. 5B, metal portions corresponding to the boundary metal cuts can be removed to define the boundary of a standard cell. Because internal metal cuts 533 and 535, placed on the same M0 interconnect, can be inserted into standard cells 501 and 502 to disconnect the unused metal portion 1 of M0 interconnect at the cell-to-cell boundaries of standard cells 501 and 502, in some embodiments, no boundary metal cut needs to be placed on the cell-to-cell boundaries of standard cells 501 and 502. In accordance with the spacing rule, the minimum allowed length of metal portion 1 can be about S1, as shown in FIG. 5B. Although metal portion 1 is connected at the cell-to-cell boundaries of standard cells 501 and 502, no parasitic capacitance can be formed in metal portion 1 for its disconnection from the rest of M0 interconnect 515. Thus, the reduced parasitic capacitance can be maximized/optimized in M0 interconnect 515 between standard cells 501 and 502. Similarly, metal portions 2 and 3, each equaling substantially to about S1, can represent the disconnected metal portions between standard cells 501 and 502 in M0 interconnect 519 and between standard cells 502 and 503 in M0 interconnect 516, respectively. Because metal portions 1, 2, and 3 are disconnected from the rest of the corresponding M0 interconnects, in some embodiments, no boundary metal cuts need to be placed on the corresponding cell-to-cell boundaries to disconnect the metal portions. Thus, the number of boundary metal cuts and internal metal cuts are minimized or optimized. That is, an optimized number of parasitic capacitances can be reduced by a minimum number of metal cuts and internal metal cuts. That is, metal interconnects, e.g., M0 interconnects, can still appear continuous along cell-to-cell boundaries and have reduced parasitic capacitances.

Thus, using the disclosed metal cut optimization structure, metal portions 1-7, in addition to the boundary metal portions, can be disconnected from the corresponding metal interconnects in standard cells 501-503. Each one of standard cells 501-503 can have reduced redundant metal interconnect portions and thus reduced parasitic capacitances. The critical paths in standard cells 501-503 can have reduced setup times and reduced power consumption.

Figure 6:
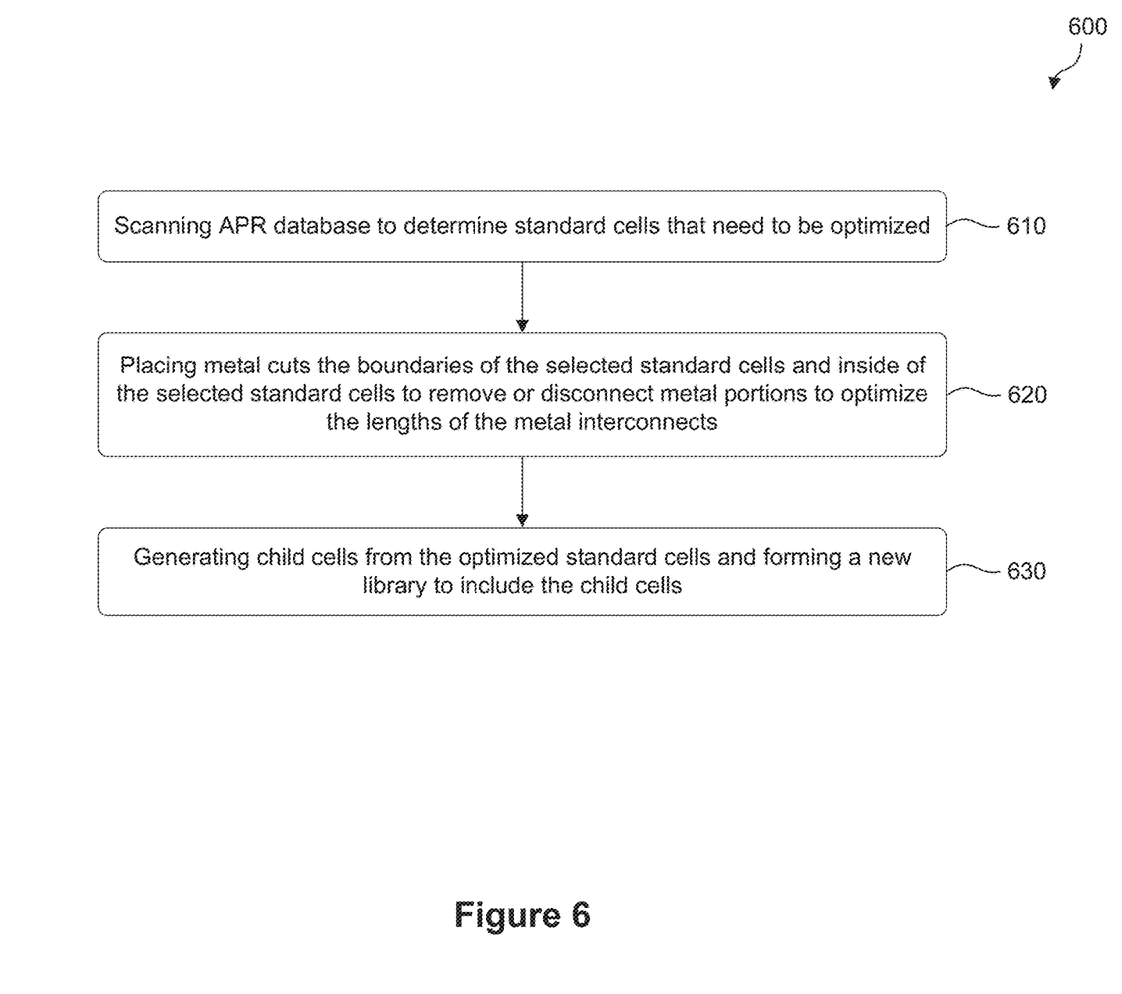
FIG. 6 is an illustration of a method for metal cut optimization in a standard cell, according to some embodiments.

FIG. 6 is an illustration of a method 600 for metal cut optimization in a standard cell, according to some embodiments. In some embodiments, operations/steps of method 600 can be performed in different orders. Variations of method 600 should also be within the scope of the present disclosure.

At operation 610, an APR database is scanned to determine standard cells that need to be optimized. These selected standard cells are placed in a layout area. In some embodiments, the setup times and power consumption of the critical paths of standard cells are checked, and standard cells with undesirably long setup times and/or undesirably high power consumption are selected to be optimized. In some embodiments, the standard cells are selected according to certain criteria, e.g., criteria for determining whether a setup time is too long and/or a power consumption is too high. The standard cells can be any standard cell in the APR database, e.g., standard cells described above in FIGS. 3-5.

At operation 620, metal cuts are placed on the boundaries of the selected standard cells and inside of the selected standard cells to remove or disconnect metal portions to optimize the lengths of the metal interconnects. The arrangement of the metal cuts is in accordance with design-rule-check (DRC) rules. In some embodiments, before metal cuts are placed, it is determined that whether it is possible to insert metal cuts on the selected standard cells without violating the spacing rules and/or DRC rules. In some embodiments, DRC rules includes the spacing rules of the metal cut optimization structure described above. In some embodiments, metal cuts are also inserted to shorten pin metal length. In some embodiments, the arrangement of metal cuts for shortening of pin metal length is also consistent with DRC rules.

At operation 630, child cells are generated from the optimized standard cells and a new library is formed to include the child cells. In some embodiments, selected standard cells, used in various circuit parts, are swapped or replaced with the corresponding child cells to update the setup times and power consumptions of critical paths.

Figure 7:
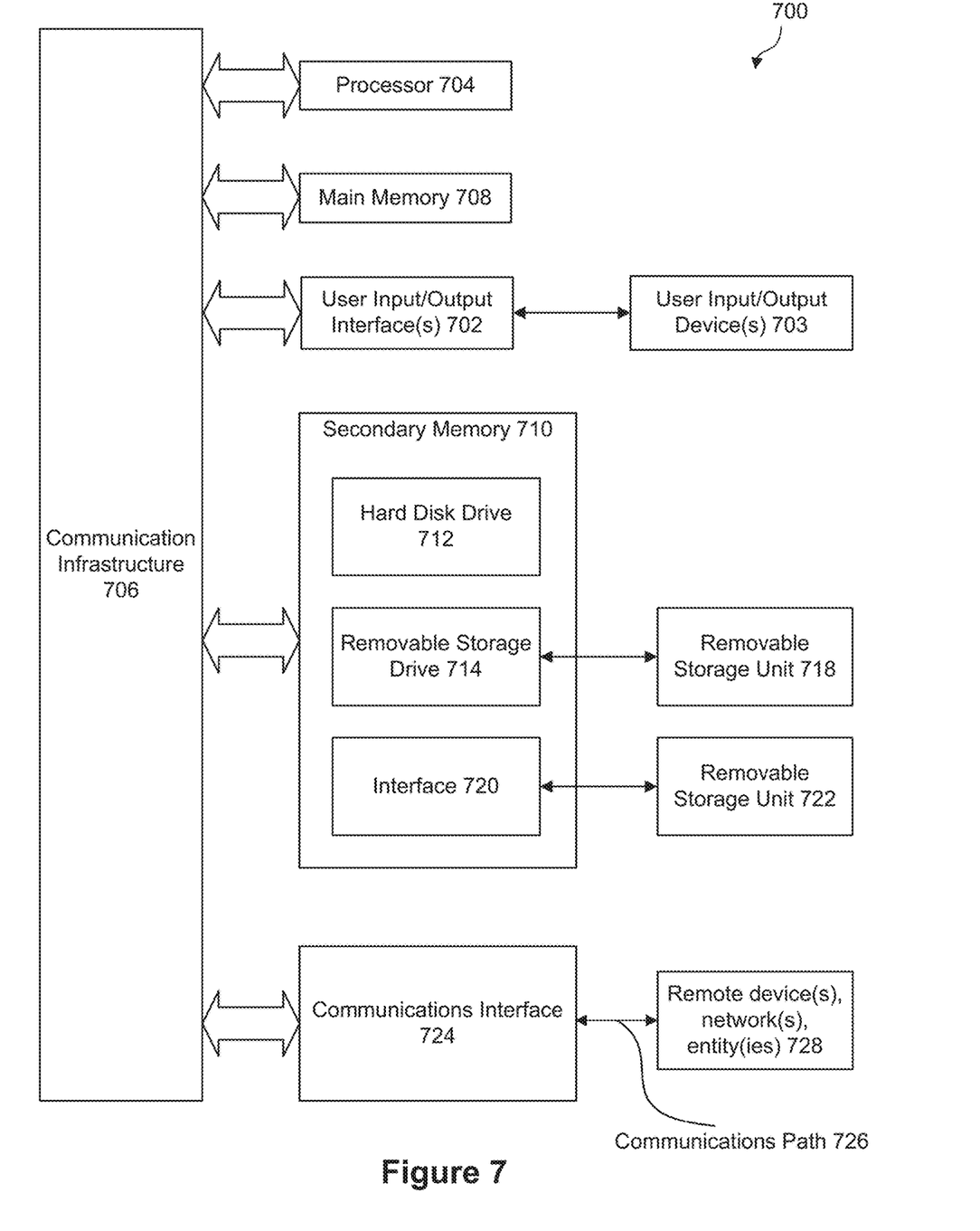
FIG. 7 is an illustration of an example computer system for implementing various embodiments of the present disclosure.

FIG. 7 is an illustration of an example computer system 700 in which various embodiments of the present disclosure can be implemented, according to some embodiments. Computer system 700 can be any well-known computer capable of performing the functions and operations described herein. For example, and without limitation, computer system 700 can be capable of selecting standard cells to be optimized and placing metal cuts at desired locations in the standard cells, for example, an EDA tool. Computer system 700 can be used, for example, to execute one or more operations in method 600, which describes an example method for placing metal cuts in standard cells in a layout area.

Computer system 700 includes one or more processors (also called central processing units, or CPUs), such as a processor 704. Processor 704 is connected to a communication infrastructure or bus 706. Computer system 700 also includes input/output device(s) 703, such as monitors, keyboards, pointing devices, etc., that communicate with communication infrastructure or bus 706 through input/output interface(s) 702. An EDA tool can receive instructions to implement functions and operations described herein—e.g., method 600 of FIG. 6—via input/output device(s) 703. Computer system 700 also includes a main or primary memory 708, such as random access memory (RAM). Main memory 708 can include one or more levels of cache. Main memory 708 has stored therein control logic (e.g., computer software) and/or data. In some embodiments, the control logic (e.g., computer software) and/or data can include one or more of the operations described above with respect to method 600 of FIG. 6.

Computer system 700 can also include one or more secondary storage devices or memory 710. Secondary memory 710 can include, for example, a hard disk drive 712 and/or a removable storage device or drive 714. Removable storage drive 714 can be a floppy disk drive, a magnetic tape drive, a compact disk drive, an optical storage device, tape backup device, and/or any other storage device/drive.

Removable storage drive 714 can interact with a removable storage unit 718. Removable storage unit 718 includes a computer usable or readable storage device having stored thereon computer software (control logic) and/or data. Removable storage unit 718 can be a floppy disk, magnetic tape, compact disk, DVD, optical storage disk, and/any other computer data storage device. Removable storage drive 714 reads from and/or writes to removable storage unit 718 in a well-known manner.

According to some embodiments, secondary memory 710 can include other means, instrumentalities or other approaches for allowing computer programs and/or other instructions and/or data to be accessed by computer system 700. Such means, instrumentalities or other approaches can include, for example, a removable storage unit 722 and an interface 720. Examples of the removable storage unit 722 and the interface 720 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 710, removable storage unit 718, and/or removable storage unit 722 can include one or more of the operations described above with respect to method 600 of FIG. 6.

Computer system 700 can further include a communication or network interface 724. Communication interface 724 enables computer system 700 to communicate and interact with any combination of remote devices, remote networks, remote entities, etc. (individually and collectively referenced by reference number 728). For example, communication interface 724 can allow computer system 700 to communicate with remote devices 728 over communications path 726, which can be wired and/or wireless, and which can include any combination of LANs, WANs, the Internet, etc. Control logic and/or data can be transmitted to and from computer system 700 via communication path 726.

The operations in the preceding embodiments can be implemented in a wide variety of configurations and architectures. Therefore, some or all of the operations in the preceding embodiments—e.g., method 600 of FIG. 6 and method 800 of FIG. 8 (described below)—can be performed in hardware, in software or both. In some embodiments, a tangible apparatus or article of manufacture comprising a tangible computer useable or readable medium having control logic (software) stored thereon is also referred to herein as a computer program product or program storage device. This includes, but is not limited to, computer system 700, main memory 708, secondary memory 710 and removable storage units 718 and 722, as well as tangible articles of manufacture embodying any combination of the foregoing. Such control logic, when executed by one or more data processing devices (such as computer system 700), causes such data processing devices to operate as described herein. In some embodiments, computer system 700 is installed with software to perform operations in the manufacturing of photomasks and circuits, as illustrated in method 800 of FIG. 8 (described below). In some embodiments, computer system 700 includes hardware/equipment for the manufacturing of photomasks and circuit fabrication. For example, the hardware/equipment can be connected to or be part of element 728 (remote device(s), network(s), entity(ies) 728) of computer system 700.

Figure 8:
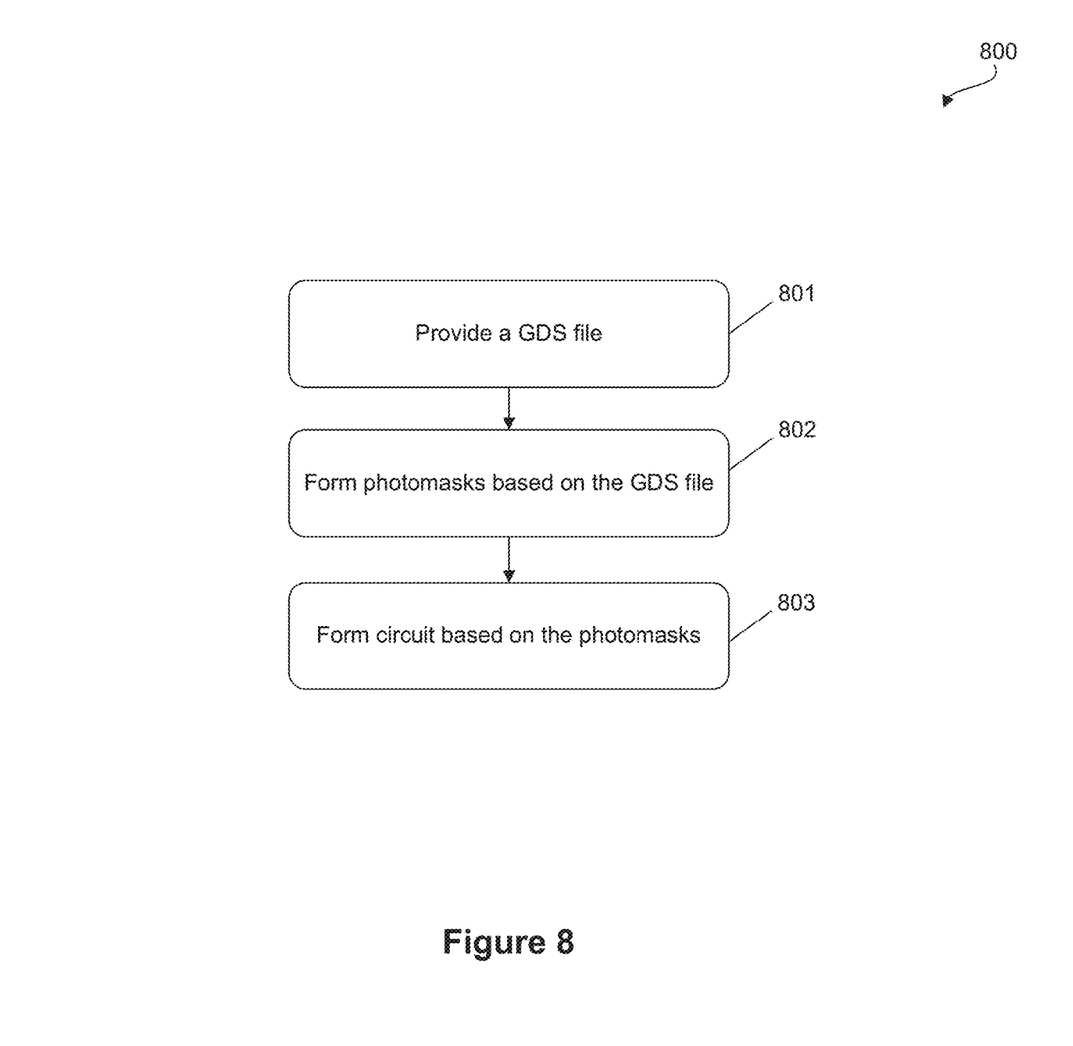
FIG. 8 is an illustration of a process to form a standard cell structure based on a graphic database system (GDS) file, according to some embodiments of the present disclosure.

FIG. 8 is an illustration of an exemplary method 800 for circuit fabrication, according to some embodiments. In some embodiments, operations/steps of method 800 can be performed in a different order. Variations of method 800 should also be within the scope of the present disclosure.

In operation 801, a GDS file is provided. The GDS file can be generated by an EDA tool and include standard cell structures optimized based on the present disclosure. The operation depicted in 801 can be performed by, for example, an EDA tool that operates on a computer system, such as computer system 700 described above.

In operation 802, photomasks are formed based on the GDS file. In some embodiments, the GDS file provided in operation 801 is taken to a tape-out operation to generate photomasks for fabricating one or more integrated circuits. In some embodiments, a circuit layout included in the GDS file can be read and transferred onto a quartz or glass substrate to form opaque patterns that correspond to the circuit layout. The opaque patterns can be made of, for example, chromium or other suitable metals. Operation 802 can be performed by a photomask manufacturer, where the circuit layout is read using a suitable software tool (e.g., an EDA tool) and the circuit layout is transferred onto a substrate using a suitable printing/deposition tool. The photomasks reflect the circuit layout/features included in the GDS file.

In operation 803, one or more circuits are formed based on the photomasks generated in operation 802. In some embodiments, the photomasks are used to form patterns/structures of the circuit contained in the GDS file. In some embodiments, various fabrication tools (e.g., photolithography equipment, deposition equipment, and etching equipment) are used to form features of the one or more circuits.

The present disclosure describes a metal cut process to optimize the removal or disconnection of metal interconnect portions in standard cells to reduce parasitic capacitance. Benefits of reducing parasitic capacitance in the standard cell include improving setup time of critical paths and reducing power consumption caused by critical paths, thus improving standard cell performance. In reducing parasitic capacitance, embodiments of the present disclosure do not require additional mask layers and have little or no impact on the layout area of the standard cells.

In some embodiments, a method for optimizing metal cuts in standard cells, of the present disclosure, includes placing a standard cell in an layout area and inserting a metal cut along a metal interconnect of the standard cell at a location away from a boundary of the standard cell. The method also includes disconnecting, at the location, a metal portion of the metal interconnect from a remaining portion of the metal interconnect based on the metal cut. At least one of the placing, inserting, and disconnecting is performed by a processor.

In some embodiments, a non-transitory computer-readable medium contains computer-executable program for, when being executed by a processor, implementing a method for optimizing metal cuts in standard cells. The method of the present disclosure includes placing a standard cell in an layout area and inserting a metal cut along a metal interconnect of the standard cell at a location away from a boundary of the standard cell. The method further includes disconnecting, at the location, a metal portion of the metal interconnect from a remaining portion of the metal interconnect based on the metal cut.

In some embodiments, a computer system for optimizing metal cuts in metal cuts on standard cells, of the present disclosure, includes a memory configured for storing a program and data for optimizing metal cuts, a user interface configured for receiving information from a user, and a processor. The processor is configured for placing a standard cell in an layout area and inserting a metal cut along a metal interconnect of the standard cell at a location away from a boundary of the standard cell. The processor is further configured for disconnecting, at the location, a metal portion of the metal interconnect from a remaining portion of the metal interconnect based on the metal cut.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method for optimizing standard cells, comprising:
   scanning an automatic place and route (APR) database, wherein the APR database comprises of a plurality of standard cells;
   identifying one or more standard cells of the plurality of standard cells;
   inserting a metal cut along a metal interconnect of a standard cell of the one or more standard cells at a location away from a boundary of the standard cell; and
   disconnecting, at the location, a metal portion of the metal interconnect from a remaining portion of the metal interconnect based on the metal cut.

2. The method of claim 1, wherein identifying the one or more standard cells comprises:
   checking at least one of a setup time and a power consumption of one or more critical paths associated with the one or more standard cells; and
   determining whether at least one of the setup time and the power consumption exceeds a predetermined criteria.

3. The method of claim 2, wherein inserting the metal cut comprises inserting the metal cut at the location based on the at least one of the setup time and the power consumption exceeding the predetermined criteria.

4. The method of claim 1, wherein inserting the metal cut comprises determining whether the location satisfies a spacing rule between the metal cut and a neighboring metal cut.

5. The method of claim 4, wherein determining whether the location satisfies the spacing rule comprises determining a spacing between the metal cut and the neighboring metal cut based on a cell poly pitch (CPP) spacing between two active gate structures minus a width of the metal cut.

6. The method of claim 5, further comprising inserting another metal cut along the metal interconnect, wherein a minimum spacing between the metal cut and the other metal cut is about twice the CPP spacing minus the width of the metal cut.

7. The method of claim 5, further comprising inserting another metal cut along an other metal interconnect misaligned with the metal cut along a direction vertical to a direction the metal interconnect extends, wherein a minimum spacing between the metal cut and the other metal cut along the direction the metal interconnect extends is about the CPP spacing minus the width of the metal cut.

8. The method of claim 1, further comprising determining a critical path portion and a redundant portion of a metal interconnect associated with each of the plurality of standard cells, and wherein the location is between the critical path portion and the redundant portion.

9. A non-transitory computer-readable medium containing computer-executable program for, when being executed by a processor, implementing a method for optimizing standard cells, comprising:
   scanning an automatic place and route (APR) database, wherein the APR database comprises a plurality of standard cells;
   identifying one or more standard cells of the plurality of standard cells by determining whether at least one characteristic of the one or more standard cells exceeds a predetermined criteria;
   optimizing the one or more standard cells, comprising:
      determining a critical path portion and a redundant portion of a metal interconnect associated with each of the one or more standard cells;
      inserting a metal cut along the metal interconnect and between the critical path portion and the redundant portion at a location away from a boundary of each of the one or more standard cells; and
      disconnecting, at the location, the critical path portion and the redundant portion of the metal interconnect based on the metal cut; and
   forming a standard cell library in the APR database, wherein the standard cell library comprises the one or more optimized standard cells.

10. The non-transitory computer-readable medium of claim 9, wherein identifying the one or more standard cells comprises determining whether the at least one characteristic of the one or more standard cells exceeds the predetermined criteria based on a setup time and power consumption of the metal interconnect associated with the one or more standard cells.

11. The non-transitory computer-readable medium of claim 9, wherein inserting the metal cut comprises determining whether the location satisfies a spacing rule between the metal cut and a neighboring metal cut.

12. The non-transitory computer-readable medium of claim 11, wherein determining whether the location satisfies the spacing rule comprises determining a spacing between the metal cut and the neighboring metal cut based on a cell poly pitch (CPP) spacing between two active gate structures minus a width of the metal cut.

13. The non-transitory computer-readable medium of claim 12, further comprising inserting an other metal cut along the metal interconnect, wherein a minimum spacing between the metal cut and the other metal cut is about twice the CPP spacing minus the width of the metal cut.

14. The non-transitory computer-readable medium of claim 12, further comprising inserting an other metal cut along an other metal interconnect aligned with the metal cut along a direction vertical to a direction the metal interconnect extends, wherein a minimum spacing between the metal cut and the other metal cut along the direction the metal interconnect extends is zero.

15. The non-transitory computer-readable medium of claim 12, further comprising inserting an other metal cut along an other metal interconnect misaligned with the metal cut along a direction vertical to a direction the metal interconnect extends, wherein a minimum spacing between the metal cut and the other metal cut along the direction the metal interconnect extends is about the CPP spacing minus the width of the metal cut.

16. A computer system for optimizing standard cells, comprising:
   a memory configured to store a program and data associated with optimized metal cuts; and
   a processor communicatively coupled to the memory and configured to:
      scan an automatic place and route (APR) database, wherein the APR database comprises of a plurality of standard cells;
      determine whether at least one of a setup time and power consumption of a metal interconnect associated with a standard cell of the plurality of standard cells exceeds a predetermined criteria;
      in response to at least one of the setup time and the power consumption of the metal interconnect exceeding the predetermined criteria, determine a critical path portion and a redundant portion of the metal interconnect;
      insert a metal cut along the metal interconnect of the standard cell between the critical path portion and the redundant portion at a location away from a boundary of the standard cell; and
      disconnect, at the location, the critical path portion and the redundant portion of the metal interconnect based on the metal cut.

17. The computer system of claim 16, wherein to insert the metal cut, the processor is further configured to determine whether the location satisfies a spacing rule between the metal cut and a neighboring metal cut.

18. The computer system of claim 17, wherein to determine whether the location satisfies the spacing rule, the processor is further configured to determine a spacing between the metal cut and the neighboring metal cut based on a cell poly pitch (CPP) spacing between two active gate structures minus a width of the metal cut.

19. The computer system of claim 18, wherein the processor is further configured to insert an other metal cut along the metal interconnect, wherein a minimum spacing between the metal cut and the other metal cut is about twice the CPP spacing minus the width of the metal cut.

20. The computer system of claim 18, wherein the processor is further configured to insert an other metal cut along an other metal interconnect aligned with the metal cut along a direction vertical to a direction the metal interconnect extends, wherein a minimum spacing between the metal cut and the other metal cut along the direction the metal interconnect extends is zero.

* * * * *

UNITED STATES PATENT AND TRADEMARK OFFICE
CERTIFICATE OF CORRECTION

PATENT NO. : 11,030,368 B2  
APPLICATION NO. : 16/881706  
DATED : June 8, 2021  
INVENTOR(S) : Lei et al.

Page 1 of 1

It is certified that error appears in the above-identified patent and that said Letters Patent is hereby corrected as shown below:

On the Title Page

Column 2, Item (57), under "ABSTRACT", Line 3, delete "an layout" and insert --a layout--, therefor.

In the Specification

In Column 1, Line 38, delete "FIG." and insert --FIGS.--, therefor.

In Column 3, Line 8, delete "1A-C" and insert --1A-1C--, therefor.

In Column 3, Line 12, delete "1A-C," and insert --1A-1C,--, therefor.

In Column 3, Line 52, delete "2A-E" and insert --2A-2E--, therefor.

In Column 3, Line 54, delete "2A-E" and insert --2A-2E--, therefor.

In Column 5, Line 7, delete "2A-E" and insert --2A-2E--, therefor.

In Column 13, Line 5, delete "an layout" and insert --a layout--, therefor.

In Column 13, Line 18, delete "an layout" and insert --a layout--, therefor.

In Column 13, Line 30, delete "an layout" and insert --a layout--, therefor.

In the Claims

In Column 14, Claim 9, Line 57, delete "cells; and" and insert --cells;--, therefor.

Signed and Sealed this  
Tenth Day of August, 2021

Drew Hirshfeld  
*Performing the Functions and Duties of the*  
*Under Secretary of Commerce for Intellectual Property and*  
*Director of the United States Patent and Trademark Office*